United States Patent
Yeh

(10) Patent No.: US 8,052,451 B2
(45) Date of Patent: Nov. 8, 2011

(54) LOAD PLATE OF LAND GRID ARRAY SOCKET CONNECTOR AND METHOD OF MANUFACTURING THE SAME

(75) Inventor: Cheng-Chi Yeh, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 96 days.

(21) Appl. No.: 12/581,929

(22) Filed: Oct. 20, 2009

(65) Prior Publication Data
US 2010/0099294 A1    Apr. 22, 2010

(30) Foreign Application Priority Data
Oct. 20, 2008    (TW) ................................ 097140118

(51) Int. Cl.
*H01R 13/62* (2006.01)
(52) U.S. Cl. ............... 439/331; 439/73; 72/379.2
(58) Field of Classification Search .......... 439/331, 439/73; 72/379.2
See application file for complete search history.

(56) References Cited

U.S. PATENT DOCUMENTS

| 6,692,279 | B1 * | 2/2004 | Ma ................. | 439/331 |
| 6,916,195 | B2 | 7/2005 | Byquist | |
| 7,033,198 | B2 * | 4/2006 | Chiang ............ | 439/331 |
| 7,387,523 | B2 * | 6/2008 | Hsu ................. | 439/331 |
| 7,867,006 | B2 * | 1/2011 | Yeh ................. | 439/331 |
| 7,909,631 | B2 * | 3/2011 | Ma ................. | 439/331 |

* cited by examiner

*Primary Examiner* — Xuong Chung Trans
(74) *Attorney, Agent, or Firm* — Ming Chieh Chang; Wei Te Chung; Andrew C. Cheng

(57) ABSTRACT

A socket connector (1), used for receiving a CPU (central processing unit), includes an insulative housing (40), a plurality of electrical contacts received insulative housing, a metallic reinforcing plate (20) receiving the insulative housing, a load plate (10) pivotally mounted to the reinforcing plate, and a lever (30) pivotally rotatable to lock with the reinforcing plate and to position the load plate in a closed position relative to the insulative housing. The load plate is produced by the steps of providing a piece of metal sheet; drawing the metal sheet to have a rectangular base portion (A1) with side walls (106) extending upwardly therefrom wherein the side walls integrally interconnects to each other without a slit; hammering a center portion (B1) of the base portion in such a manner that a thickness of the center portion is thinner than that of the rest portions (101) therearound; and excavating the center portion to be a cutout (11).

11 Claims, 5 Drawing Sheets

LOAD PLATE OF LAND GRID ARRAY SOCKET CONNECTOR AND METHOD OF MANUFACTURING THE SAME

BACKGROUND OF THE INVENTION

1. Field of the Invention

The present invention relates generally to an LGA (land grid array) socket connector, and more particularly to a load plate of the socket connector having larger intensity.

2. Description of Related Arts

U.S. Pat. No. 6,916,195 issued to Byquist on Jul. 12, 2005 discloses an LGA (land grid array) socket connector comprising an insulative housing, a plurality of contacts received in the insulative housing, a load plate pivotally positioned between an open position and a closed position, a load lever pivotally mounted on an opposite end relative to the load plate, and a reinforcing plate below the insulative housing. The load plate moves toward the insulative housing and is positioned at the closed position by the load lever locked to the reinforcing plate. The load plate has a thickness standardized in such a field. When the socket connector asks for much larger pressure against a CPU (central processing unit) received therein, the load plate is usually replaced by another much more rigid material or increased merely in thickness. Much more rigid material disadvantages in high cost, and the method by replacing much more rigid material is uneconomical. The load plate defines a cutout in the middle thereof for the CPU connecting with a heat sink for heat transmission. The second method by increasing in thickness means that a much more material is discarded. The waste of material of the second method is really high, too.

Hence, an LGA socket connector comprising a load plate having larger intensity and reducing cost is desired.

SUMMARY OF THE INVENTION

Accordingly, an object of the present invention is to provide an LGA socket connector comprising a load plate having larger intensity and reducing cost is desired.

To achieve the above object, a socket connector, used for receiving a CPU (central processing unit), includes an insulative housing, a plurality of electrical contacts received insulative housing, a metallic reinforcing plate receiving the insulative housing, a load plate pivotally mounted to the reinforcing plate, and a lever pivotally rotatable to lock with the reinforcing plate and to position the load plate in a closed position relative to the insulative housing. The load plate is produced by the steps of providing a piece of metal sheet; drawing the metal sheet to have a rectangular base portion with side walls extending upwardly therefrom wherein the side walls integrally interconnects to each other without a slit; hammering a center portion of the base portion in such a manner that a thickness of the center portion is thinner than that of the rest portions therearound; and excavating the center portion to be a cutout.

Other objects, advantages and novel features of the invention will become more apparent from the following detailed description when taken in conjunction with the accompanying drawings.

DETAILED DESCRIPTION OF THE PREFERRED EMBODIMENT

Figure 1:
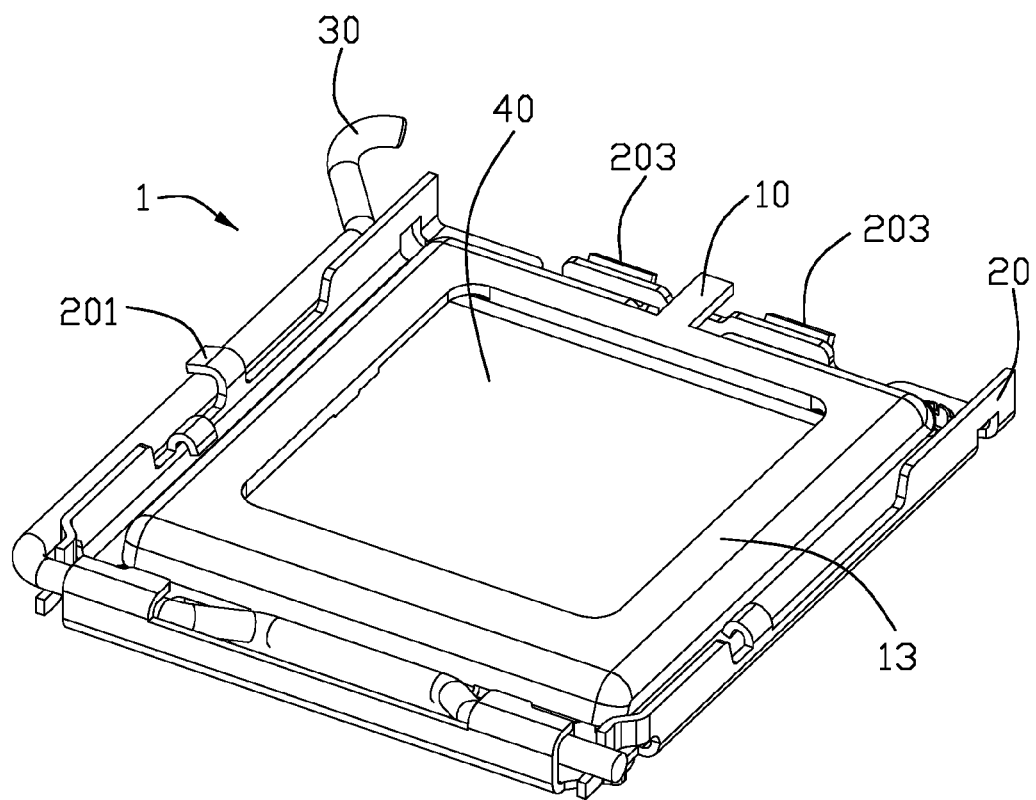
FIG. 1 is a perspective, assembled view of an LGA socket connector in a closed position constructed in accordance with the present invention.
Figure 2:
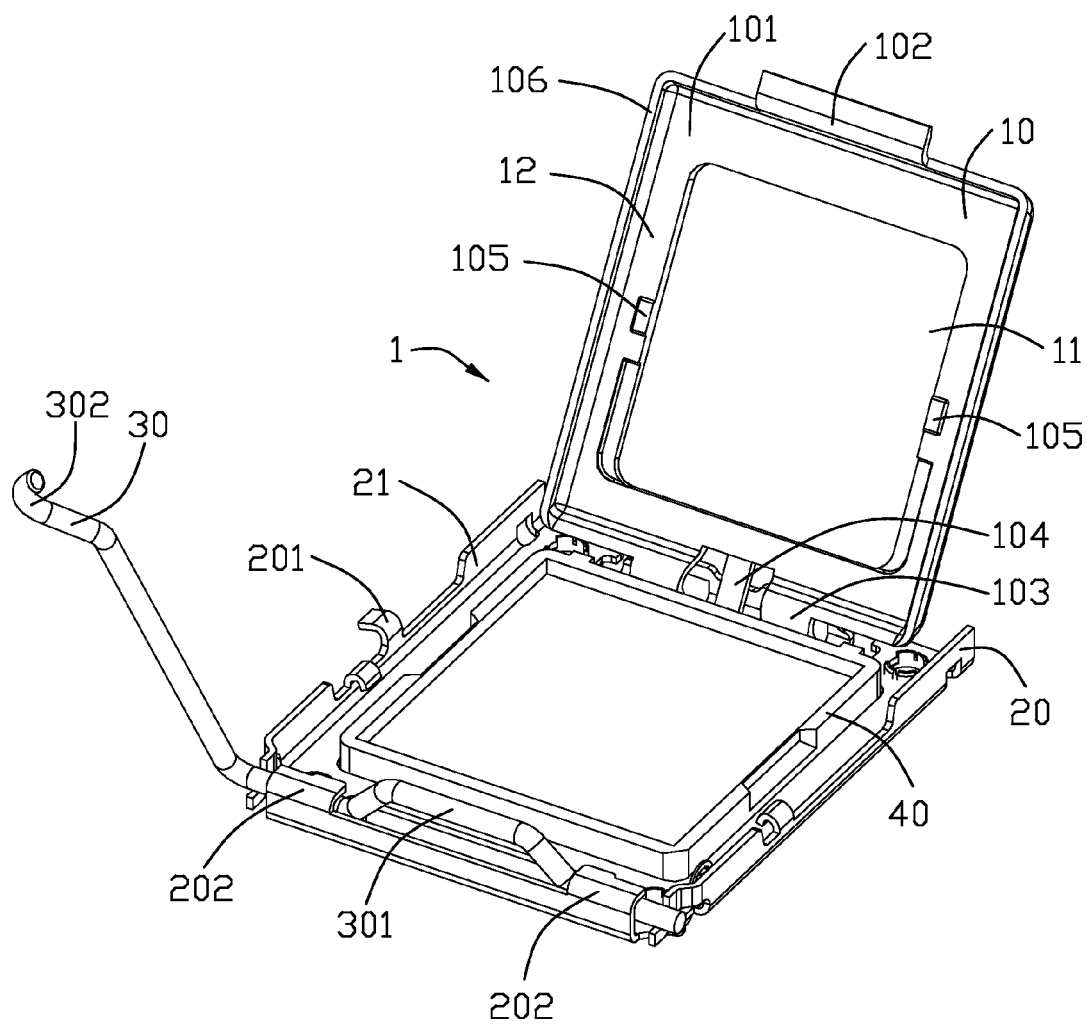
FIG. 2 is a perspective, assembled view of the LGA socket connector when the load plate is in an open position.

Referring to FIGS. 1-2, an LGA socket connector 1 of the present invention, used for connecting a CPU (central processing unit, not shown) with a PCB (printed circuit board, not shown), comprises an insulative housing 40, a plurality of electrical contacts (not shown) received in the insulative housing 40, a metallic reinforcing plate 20 positioned on a bottom surface of the insulative housing 40, a load plate 10 pivotally positioned on a top surface of the insulative housing 40, and a load lever 30 attached to the reinforcing plate 20, pivotally rotated and positioning the load plate 10 in a closed position.

Referring to FIGS. 1-2, the reinforcing plate 20 is positioned on a bottom surface of the insulative housing 40 for receiving the insulative housing 40. The reinforcing plate 20 is frame shaped and comprises a flange 201 extending outwardly from an upper edge of a lateral wall 21, a pair of inflexed blocking pieces 202 bending inwardly from a front end thereof and a pair of interconnect pieces 203 extending from a rear end opposite to the blocking pieces 202.

Referring to FIG. 2, the lever 30 is substantially L-configured. The lever 30 comprises a locating shaft 301 and an operating shaft 302 extending vertically from the locating shaft 301. The locating shaft 301 is secured with the blocking pieces 202 to pivotally lock with the reinforcing plate 20. The operating shaft 302 is interlocked with the flange 201 when the load plate 10 is pivotally positioned in the closed position.

Referring to FIGS. 1-2, the load plate 10 is pivotally mounted on the rear end of the reinforcing plate 20. The load plate 10 is substantially frame shaped and defines an excavated cutout 11 in the middle thereof. The load plate 10 comprises a base portion 101 encircling around the cutout 11 and a plurality of side walls 106 extending vertically from the base portion 101, each interconnecting with each other. Because the side walls 106 interconnect with each other, the load plate 10 is prevented from distortion. The base portion 101 forms a pair of protrusions 105 positioned at two sides of the cutout 11 for balanced reinforcing pressure on the CPU. The load plate 10 comprises a pair of bearing pieces 103 pivotally engaging with the interconnect pieces 203 of the reinforcing plate 20 and a holding element 104 is spaced between the bearing pieces 103. The load plate 10 further comprises a locking element 102 arranged at an opposite side of the bearing pieces 103 to be pressed against by the locating shaft 301 of the load lever 30 when the load plate 10 is in the closed position.

Figure 3:
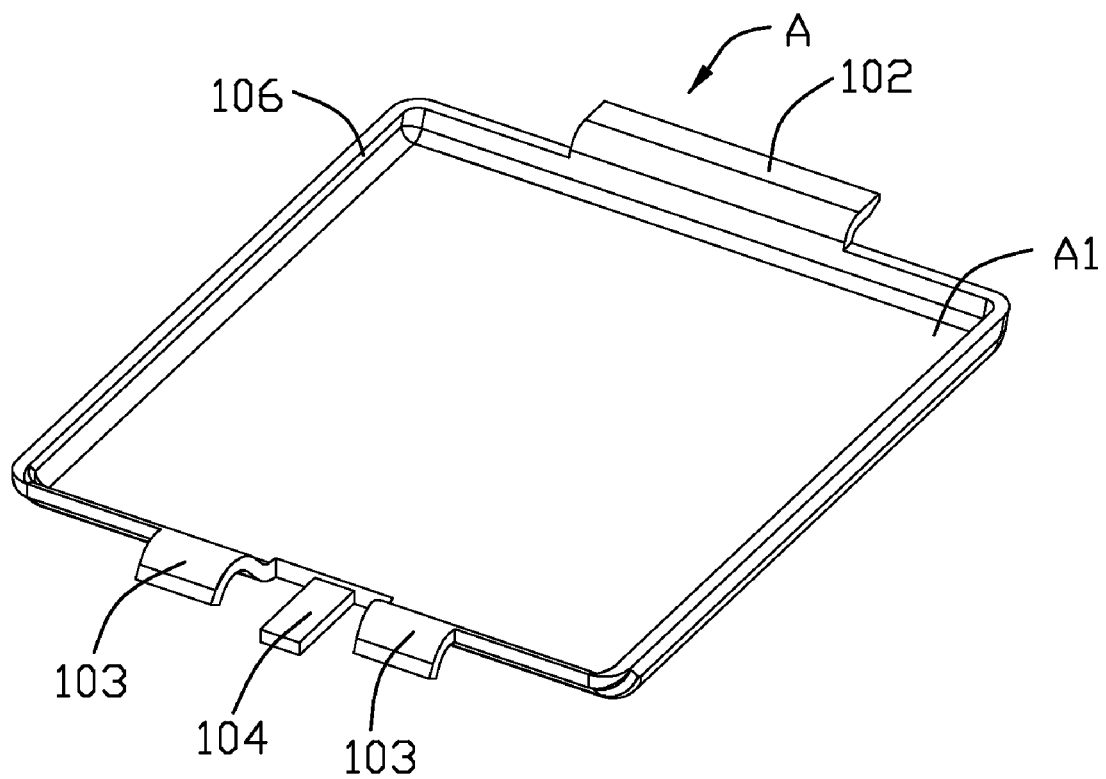
FIG. 3 is a perspective view of the load plate of the LGA socket connector in an initial model having a standard thickness.
Figure 4:
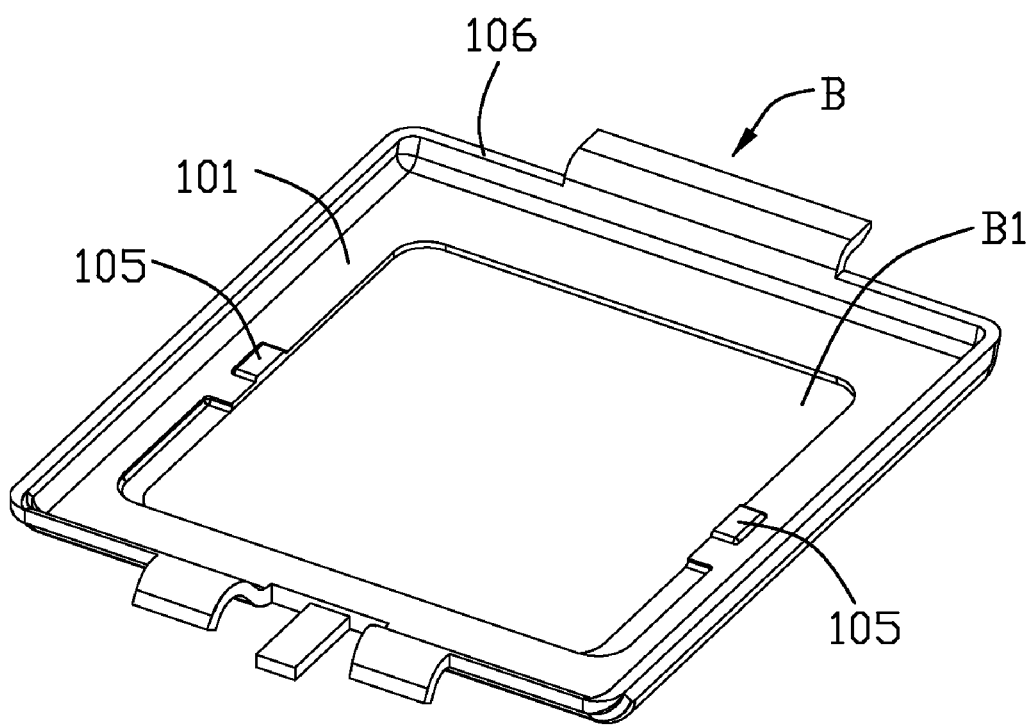
FIG. 4 is a perspective view of the load plate in a rudiment model having a thickness thinner in the middle thereof and thicker in the periphery thereof.
Figure 5:
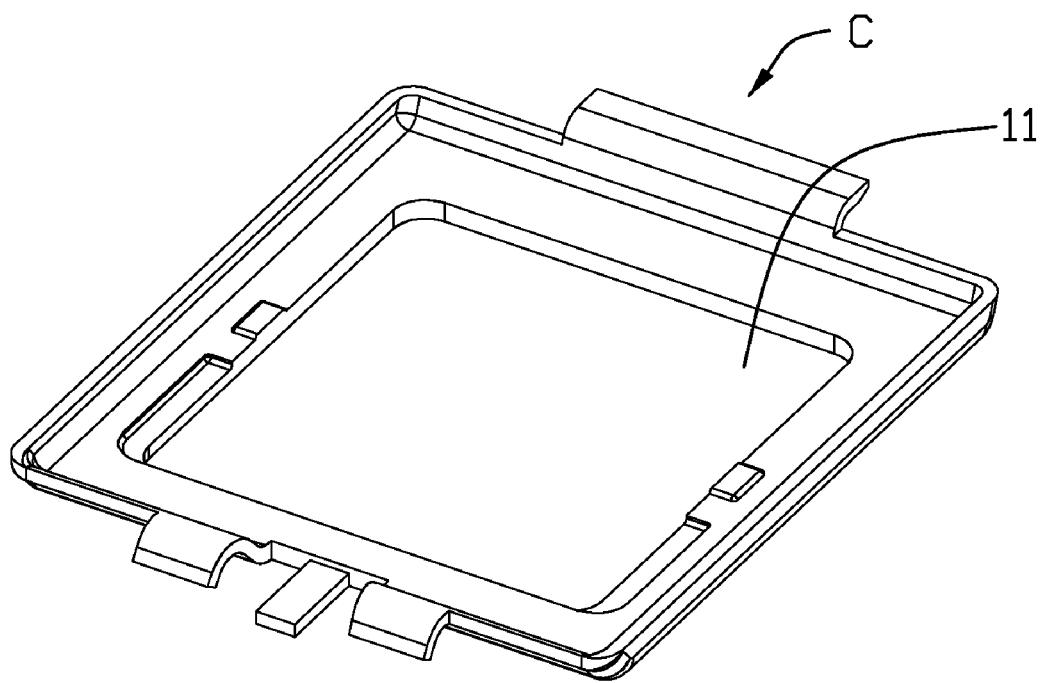
FIG. 5 is a perspective view of the load plate in a final model with a cutout excavated in the middle thereof.

The base portion 101 of the load plate 10 has a relatively larger thickness because the load plate 10 is produced in the following steps, referring to FIGS. 3-5: providing a piece of metal sheet; drawing the metal sheet to have a rectangular base portion A1 with side walls 106 extending upwardly therefrom wherein the side walls 106 integrally interconnects to each other without a slit; hammering and thinner a center portion B1 of the base portion 101 so as to expel the corresponding material toward and thus thicken the rest portions therearound; and excavating the center portion B1 to be a cutout 11. The protrusions 105 are formed in the hammering process. The bearing pieces 103, the holding element 104 and the locking element 102 at the opposite side of the bearing pieces 103 are formed in the drawing process, too.

Understandably, the conventional load plate is made via die casting requiring a relatively heavy and thicker dimensioned metal, for assuring the holding/pressing function thereof, which costs more money. Differently, in the instant invention the load plate is made from drawing requiring a relatively soft and thinner dimensioned metal which costs less money. Anyhow, because the remaining/peripheral base portion 101 which surrounds the excavated center portion B1, is converted from a hammered procedure which expels a part of material of the original center portion B1 to be a part of the remaining/peripheral base portion 101, the final remaining/peripheral base portion 101 owns the larger thickness than original. In other words, in the instant invention via the hammering process the thickness of the remaining/peripheral base portion 101 gets compensated as well as that of the conventional die casting load plate. On the other hand, because the side walls 106 of the load plate 10 are made via drawing in the manufacturing process without a slit between every adjacent two side walls, the whole load plate 10 is firmer enough to prevent self-damage in a high pressure holding/pressing situation due to lateral joint between the neighboring side walls. Understandably and clearly, different from that of the instant invention the convention load plate discloses the corresponding side walls not laterally joined with one another and thus such side walls of the conventional load plate can not provide the reinforcement effect for the whole load plate structure.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A socket connector, used for receiving a CPU (central processing unit), comprising:
    an insulative housing;
    a plurality of electrical contacts received in the insulative housing;
    a metallic reinforcing plate receiving the insulative housing;
    a load plate pivotally mounted to the reinforcing plate; and
    a lever pivotally rotatable to lock with the reinforcing plate and to position the load plate in a closed position relative to the insulative housing;
    wherein the load plate is produced by the steps of:
    providing a piece of metal sheet;
    drawing the metal sheet to have a rectangular base portion with side walls extending upwardly therefrom wherein the side walls integrally interconnects to each other without a slit;
    hammering a center portion of the base portion in such a manner that a thickness of the center portion is thinner than that of the rest portions therearound; and
    cutting the center portion to be a cutout.

2. The socket connector as described in claim 1, wherein the reinforcing plate comprises a pair of interconnect pieces, and the load plate comprises a pair of bearing pieces pivotally engaging with the interconnect pieces.

3. The socket connector as described in claim 1, wherein the lever comprises a locating shaft and an operating shaft extending vertically from the locating shaft.

4. The socket connector as described in claim 3, wherein the reinforcing plate comprises a pair of blocking pieces and the locating shaft is pivotally secured with the blocking pieces.

5. The socket connector as described in claim 4, wherein the locating shaft is pressed against by the locating shaft when the load plate is positioned in the closed position.

6. The socket connector as described in claim 5, wherein the reinforcing plate has a flange at a lateral side thereof and the operating shaft is interlocked with the flange when the load plate is positioned in the closed position.

7. A method for manufacturing a load plate of a socket connector, comprising the steps of:
    providing a piece of metal sheet;
    drawing the metal sheet to have a rectangular base portion with side walls extending upwardly therefrom wherein the side walls integrally interconnects to each other without a slit;
    hammering a center portion of the base portion in such a manner that a thickness of the center portion is thinner than that of the rest portions therearound; and
    cutting the center portion to be a cutout.

8. The method as described in claim 7, wherein a pair of protrusions is formed on the base portion in the hammering process.

9. The method as described in claim 8, wherein the protrusions are spaced away from each other by the cutout.

10. The method as described in claim 7, wherein a pair of bearing pieces at a first end of the base portion and a locking element at an opposite side of the bearing pieces are formed in the drawing process.

11. An electrical connector comprising:
    an insulative housing enclosing a plurality of contacts therein;
    a metallic reinforcing plate surrounding the housing; and
    a metallic load plate having one end pivotally mounted to corresponding one end of the reinforcing plate, said load plate defining a peripheral base portion essentially located in a plane and surrounding a cutting central cutout; wherein
    said base portion defines a plurality of side edges and said load plate further includes a plurality of side walls unitarily and continuously downwardly extending from the corresponding side edges, respectively, for laterally enclosing the housing under condition that the side walls unitarily join laterally with one another without a slit between every neighboring two side walls at a corresponding joining corner thereof, wherein said side walls are formed via a drawing procedure to assure no slit between every neighboring two side walls, wherein said peripheral base portion is formed via a hammering procedure for thickening.

* * * * *